(12) United States Patent
Nakajima et al.

(10) Patent No.: US 12,262,469 B2
(45) Date of Patent: Mar. 25, 2025

(54) COPPER-CLAD LAMINATE PLATE AND PRINTED WIRING BOARD

(71) Applicant: MITSUI MINING & SMELTING CO., LTD., Tokyo (JP)

(72) Inventors: Daisuke Nakajima, Ageo (JP); Shota Kawaguchi, Ageo (JP)

(73) Assignee: MITSUI MINING & SMELTING CO., LTD., Tokyo (JP)

( * ) Notice: Subject to any disclaimer, the term of this patent is extended or adjusted under 35 U.S.C. 154(b) by 236 days.

(21) Appl. No.: 18/016,120

(22) PCT Filed: Jul. 14, 2021

(86) PCT No.: PCT/JP2021/026506
§ 371 (c)(1),
(2) Date: Jan. 13, 2023

(87) PCT Pub. No.: WO2022/014648
PCT Pub. Date: Jan. 20, 2022

(65) Prior Publication Data
US 2023/0276571 A1    Aug. 31, 2023

(30) Foreign Application Priority Data

Jul. 16, 2020  (JP) .................................. 2020-121982
Mar. 17, 2021  (JP) .................................. 2021-043924

(51) Int. Cl.
*H05K 1/09*   (2006.01)
*H05K 3/38*   (2006.01)

(52) U.S. Cl.
CPC ............... *H05K 1/09* (2013.01); *H05K 3/384* (2013.01); *H05K 2201/0355* (2013.01); *H05K 2203/0307* (2013.01); *H05K 2203/0723* (2013.01)

(58) Field of Classification Search
CPC .................................. H05K 1/09; H05K 3/384
See application file for complete search history.

(56) References Cited

U.S. PATENT DOCUMENTS

2016/0183380 A1   6/2016 Ishii et al.
2016/0353581 A1  12/2016 Nagaura
(Continued)

FOREIGN PATENT DOCUMENTS

CN       105765110 A    7/2016
CN       115997047 A    4/2023
(Continued)

*Primary Examiner* — Jeremy C Norris
(74) *Attorney, Agent, or Firm* — GREENBLUM & BERNSTEIN, P.L.C.

(57) ABSTRACT

Provided is a copper-clad laminate in which a copper foil and a resin are joined together with high heat-resistant adhesion force though a fluororesin is used. This copper-clad laminate includes a surface-treated copper foil including a copper foil and a zinc-containing layer on at least one surface of the copper foil; and a sheet-shaped fluororesin on the zinc-containing layer side of the surface-treated copper foil. The zinc-containing layer is composed of Zn and a transition element M having a melting point of 1200° C. or more. When the interface between the copper foil and the zinc-containing layer is subjected to elemental analysis by GD-OES, the emission intensity ratio $I_{Zn}/I_{Cu}$ of the emission intensity of Zn to that of Cu is $3.0 \times 10^{-3}$ or less, and the emission intensity ratio $I_{Zn}/I_M$ of the emission intensity of Zn to that of the transition element M is 0.30 to 0.50.

9 Claims, 1 Drawing Sheet

(56) References Cited

U.S. PATENT DOCUMENTS

| | | |
|---|---|---|
| 2017/0208686 A1 | 7/2017 | Fukuchi |
| 2018/0139848 A1 | 5/2018 | Tateoka et al. |
| 2018/0160529 A1 | 6/2018 | Arai et al. |
| 2021/0029823 A1 | 1/2021 | Hosoi et al. |
| 2021/0360785 A1 | 11/2021 | Miyamoto et al. |
| 2023/0276579 A1 | 8/2023 | Nakajima et al. |

FOREIGN PATENT DOCUMENTS

| | | |
|---|---|---|
| JP | 2017-130658 A | 7/2017 |
| JP | 2018-090903 A | 6/2018 |
| JP | 2019-163541 A | 9/2019 |
| WO | 2017/150043 A1 | 9/2017 |
| WO | 2019/188087 A1 | 10/2019 |
| WO | 2019/208525 A1 | 10/2019 |

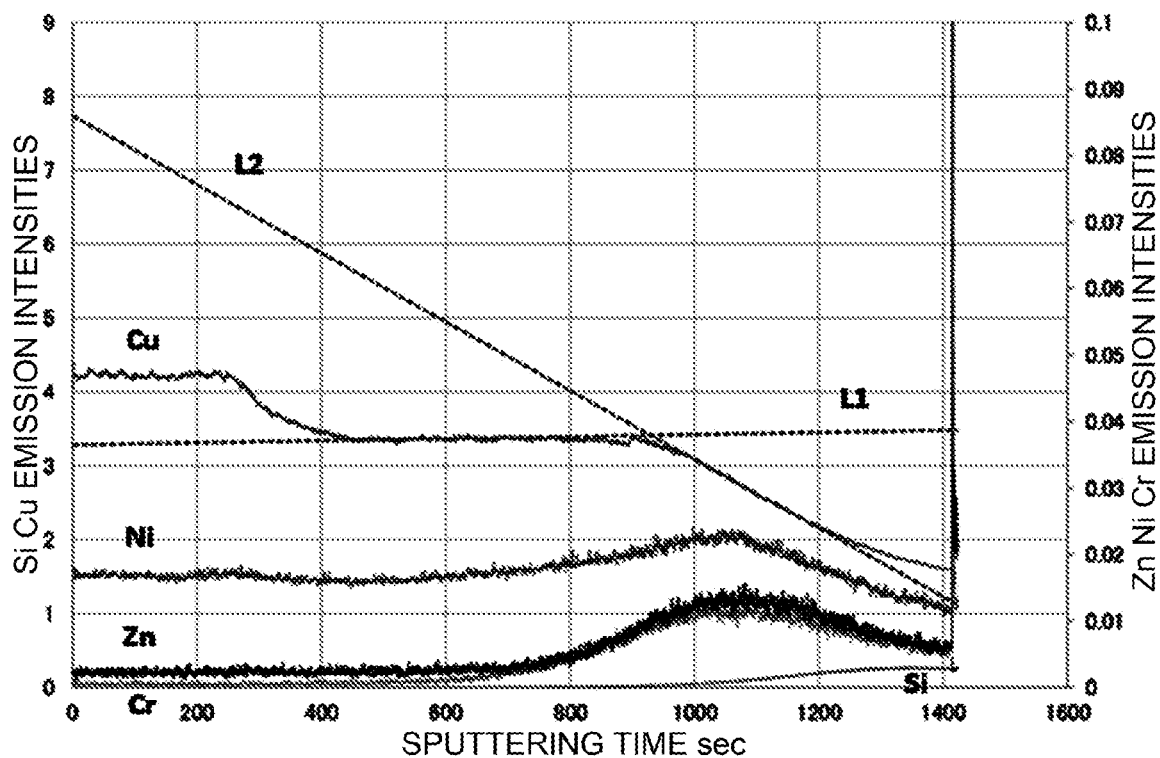

COPPER-CLAD LAMINATE PLATE AND PRINTED WIRING BOARD

TECHNICAL FIELD

The present invention relates to a copper-clad laminate and a printed wiring board.

BACKGROUND ART

With higher functionality of portable electronic equipment and the like in recent years, the frequencies of signals have become higher in order to process a large amount of information at high speed, and printed wiring boards suitable for high frequency applications such as base station antennas have been required. For such high frequency printed wiring boards, a reduction in transmission loss is desired in order to allow transmission without decreasing the quality of high frequency signals. A printed wiring board comprises a copper foil processed into a wiring pattern and an insulating resin substrate, and the transmission loss is composed mainly of the conductor loss due to the copper foil and the dielectric loss due to the insulating resin substrate. Therefore, it is convenient if a low dielectric constant thermoplastic resin can be used in order to reduce the dielectric loss due to the insulating resin substrate. However, low dielectric constant thermoplastic resins as typified by fluororesins such as polytetrafluoroethylene (PTFE) have low chemical activity and therefore have low adhesion force to copper foils, unlike thermosetting resins. Accordingly, techniques for improving the adhesion between a copper foil and a thermoplastic resin are proposed.

For example, Patent Literature 1 (WO2017/150043) discloses that adhesion to a fluororesin is ensured by using a copper foil comprising fine irregularities formed by oxidation treatment and reduction treatment.

CITATION LIST

Patent Literature

Patent Literature 1: WO2017/150043

SUMMARY OF INVENTION

However, in the copper-clad laminate in which the copper foil and a fluororesin substrate are bonded to each other disclosed in Patent Literature 1, the decrease in copper foil/substrate adhesion force at high temperature is still large. Therefore, in order to enhance reliability in applications where heat resistance is also required, further improvement of heat-resistant adhesion is required. Especially, printed wiring boards using fluororesins may be exposed to harsh environments such as high temperature, and even after the printed wiring boards are exposed to such harsh environments, high adhesion between the copper foil and the resin substrate is desired. Actually, printed wiring boards using fluororesins such as PTFE may be used for aviation and space use and the like, and also from such a viewpoint, even more improvement of adhesion at high temperature is desired. In this respect, conventionally, in order to ensure adhesion strength and reliability, there has been no alternative but to increase the roughness of the adhesion surface of the copper foil to the resin, a situation in which an increase in transmission loss in high frequency applications is unavoidable. Accordingly, another new method for achieving both adhesion and heat resistance between a copper foil and a fluororesin substrate is required.

The inventors have now found that by interposing a zinc-containing layer having a predetermined interfacial composition between a copper foil and a fluororesin, it is possible to provide a copper-clad laminate having not only high adhesion but also excellent heat resistance with which the adhesion is less likely to deteriorate even at high temperature, that is, a copper-clad laminate in which a copper foil and a fluororesin are joined together with high heat-resistant adhesion force.

Therefore, it is an object of the present invention to provide a copper-clad laminate in which a copper foil and a resin are joined together with high heat-resistant adhesion force though a fluororesin, which is a low dielectric constant thermoplastic resin, is used.

According to an aspect of the present invention, there is provided a copper-clad laminate comprising:

a surface-treated copper foil comprising a copper foil and a zinc-containing layer provided on at least one surface of the copper foil; and a sheet-shaped fluororesin provided on the zinc-containing layer side of the surface-treated copper foil, wherein the zinc-containing layer is composed of Zn and a transition element M having a melting point of 1200° C. or more, and wherein when an interface between the copper foil and the zinc-containing layer is subjected to elemental analysis by glow discharge optical emission spectrometry (GD-OES), an emission intensity ratio $I_{Zn}/I_{Cu}$, which is a ratio of an emission intensity of Zn referred to as $I_{Zn}$ to an emission intensity of Cu referred to as $I_{Cu}$, is $3.0\times10^{-3}$ or less, and an emission intensity ratio $I_{Zn}/I_{M}$, which is a ratio of an emission intensity of Zn referred to as $I_{Zn}$ to an emission intensity of the transition element M referred to as $I_{M}$, is 0.30 or more and 0.50 or less.

According to another aspect of the present invention, there is provided a printed wiring board manufactured using the copper-clad laminate.

BRIEF DESCRIPTION OF DRAWING

FIG. 1 is one example of the depth profiles of the emission intensities of various elements by glow discharge optical emission spectrometry (GD-OES). The sputtering time, the horizontal axis, corresponds to the depth direction from the copper foil toward the resin of a copper foil laminate, and the vertical axis corresponds to the emission intensities of elements, Si, Cu, Zn, Ni, and Cr.

DESCRIPTION OF EMBODIMENTS

Copper-Clad Laminate

The copper-clad laminate of the present invention comprises a surface-treated copper foil and a sheet-shaped fluororesin provided on the zinc-containing layer side of the surface-treated copper foil. The surface-treated copper foil comprises a copper foil and a zinc-containing layer provided on at least one surface of the copper foil. This zinc-containing layer is composed of Zn and a transition element M having a melting point of 1200° C. or more. When the interface between the copper foil and the zinc-containing layer is subjected to elemental analysis by glow discharge optical emission spectrometry (GD-OES), the emission intensity ratio $I_{Zn}/I_{Cu}$, the ratio of the emission intensity of Zn referred to as $I_{Zn}$ to the emission intensity of Cu referred to as $I_{Cu}$, is $3.0\times10^{-3}$ or less, and the emission intensity ratio $I_{Zn}/I_M$, the ratio of the emission intensity of Zn referred to as $I_{Zn}$ to the emission intensity of the transition element M referred to as $I_M$, is 0.30 or more and 0.50 or less. By interposing the zinc-containing layer having a predetermined interfacial composition between the copper foil and the fluororesin in this manner, it is possible to provide a copper-clad laminate having not only high adhesion but also excellent heat resistance with which the adhesion is less likely to deteriorate even at high temperature, that is, a copper-clad laminate in which a copper foil and a fluororesin are joined together with high heat-resistant adhesion force.

That is, as described above, low dielectric constant thermoplastic resins as typified by fluororesins such as polytetrafluoroethylene (PTFE) have low chemical activity and therefore intrinsically have low adhesion force to copper foils, unlike thermosetting resins. Even in the copper-clad laminate disclosed in Patent Literature 1 that addresses such a problem, the decrease in copper foil/substrate adhesion force at high temperature is still large. In this respect, conventionally, in order to ensure adhesion strength and reliability, there has been no alternative but to increase the roughness of the adhesion surface of the copper foil to the resin, a situation in which an increase in transmission loss in high frequency applications is unavoidable. On the other hand, in the copper-clad laminate of the present invention, by interposing the zinc-containing layer having a predetermined interfacial composition at the interface, both adhesion strength and heat resistance can be achieved between the copper foil and the fluororesin.

The surface-treated copper foil used in the present invention comprises a copper foil and a zinc-containing layer provided on at least one surface of the copper foil. The copper foil is preferably a roughening-treated copper foil comprising roughening particles on at least one surface, and more preferably the surface of the copper foil on the zinc-containing layer side is a roughening-treated surface. A known roughening-treated copper foil can be used. The thickness of the copper foil is not particularly limited but is preferably 0.1 μm or more and 70 μm or less, more preferably 0.5 μm or more and 18 μm or less.

As long as the zinc-containing layer is composed of Zn and a transition element M having a melting point of 1200° C. or more, its form is not particularly limited. The zinc-containing layer is preferably an alloy of Zn and M, that is, a zinc alloy. Preferred examples of the transition element M having a melting point of 1200° C. or more include Co, Fe, Ni, Mo, W, and combinations thereof, more preferably Co, Ni, Mo, and combinations thereof, and is further preferably Ni and/or Mo, particularly preferably Ni. Therefore, the zinc-containing layer is preferably composed of a Zn—Co alloy, a Zn—Fe alloy, a Zn—Ni alloy, a Zn—Mo alloy, a Zn—W alloy, a Zn—Ni—Mo alloy, or a combination thereof, more preferably a Zn—Co alloy, a Zn—Ni alloy, a Zn—Mo alloy, or a Zn—Ni—Mo alloy, further preferably a Zn—Ni alloy, a Zn—Mo alloy, or a Zn—Ni—Mo alloy, and particularly preferably a Zn—Ni alloy.

As described above, in the copper-clad laminate, when the interface between the copper foil and the zinc-containing layer is subjected to elemental analysis by GD-OES, the emission intensity ratio $I_{Zn}/I_{Cu}$, the ratio of the emission intensity of Zn referred to as $I_{Zn}$ to the emission intensity of Cu referred to as $I_{Cu}$, is $3.0\times10^{-3}$ or less, preferably $1.5\times10^{-3}$ or more and $3.0\times10^{-3}$ or less, and more preferably $2.0\times10^{-3}$ or more and $3.0\times10^{-3}$ or less. When the interface between the copper foil and the zinc-containing layer is subjected to elemental analysis by GD-OES, the emission intensity ratio $I_{Zn}/I_M$, the ratio of the emission intensity of Zn referred to as $I_{Zn}$ to the emission intensity of the transition element M referred to as $I_M$, is 0.30 or more and 0.50 or less, preferably 0.30 or more and 0.45 or less, more preferably 0.33 or more and 0.45 or less, and further preferably 0.35 or more and 0.45 or less. These emission intensities $I_{Cu}$ and $I_{Zn}$ are determined by the interface between the copper foil and the zinc-containing layer, and this interface refers to the portion of the zinc-containing layer directly on the copper foil. This portion is less likely to be affected by surface oxidation and the like and considered as a region important in providing adhesion force and heat resistance.

The elemental analysis by GD-OES can be performed by performing elemental analysis with digging down from the copper foil side toward the resin of the copper-clad laminate by sputtering to obtain the depth profiles of the emission intensities of various elements as shown in FIG. 1. In the depth profiles shown in FIG. 1, the sputtering time, the horizontal axis, corresponds to the depth direction from the copper foil toward the resin of the copper foil laminate, and the vertical axis corresponds to the emission intensities of elements such as Cu, Zn, Ni, and Cr. As shown in FIG. 1, in the depth profiles of the copper-clad laminate of the present invention, the broad peaks of rust proofing elements such as Zn, Ni, and Cr (hereinafter referred to as rust proofing element peaks) due to rust proofing layers such as the zinc-containing layer and a chromate layer are necessarily observed. Therefore, it is presumed that the interface between the copper foil and the zinc-containing layer is present in the rising portion slightly before the rust proofing element peaks (at slightly short sputtering time) in the depth direction from the copper foil side toward the resin (the direction in which the sputtering time increases). Actually, the depth profile of Cu maintains (though some fluctuations or height differences can be present) generally constant emission intensity until slightly before the rust proofing element peaks and then falls linearly with a constant slope in the region corresponding to the rust proofing element peaks, in the depth direction from the copper foil side toward the resin. By utilizing such a feature of the Cu depth profile, the interface between the copper foil and the zinc-containing layer can be uniquely identified. Specifically, the interface between the copper foil and the zinc-containing layer is defined as the intersection point X of two tangents $L_1$ and $L_2$ when on the depth profile of Cu, the first tangent $L_1$ is drawn so that the correlation coefficient is largest in the place slightly before the rust proofing element peaks (at slightly short sputtering time), and the second tangent $L_2$ is drawn so that the correlation coefficient is largest in the falling portion in the place slightly after the rust proofing element peaks (at slightly long sputtering time). The emission intensity of Cu referred to as $I_{Cu}$, the emission intensity of Zn referred to as $I_{Zn}$, and the emission intensity of the transition element M referred to as $I_M$, at the sputtering time (depth) thus identified as the intersection point X can be read from the depth profiles of the emission intensities of the elements.

The sheet-shaped fluororesin used in the copper-clad laminate of the present invention may be a cut sheet piece or a long sheet pulled out from a roll, and its form is not particularly limited. Preferred examples of the fluororesin include polytetrafluoroethylene (PTFE), tetrafluoroethylene-perfluoroalkyl vinyl ether copolymers (PFA), tetrafluoroethylene-hexafluoropropylene copolymers (FEP), tetrafluoroethylene-ethylene copolymers (ETFE), and any combination thereof.

The surface-treated copper foil may be provided on one surface of the sheet-shaped fluororesin or both surfaces. The sheet-shaped fluororesin should comprise a fluororesin and may further comprise other materials. Therefore, the sheet-shaped fluororesin may be a prepreg. A prepreg is a generic name for a composite material in which a substrate such as a synthetic resin plate, a glass plate, a glass woven fabric, a glass nonwoven fabric, or paper is impregnated with a synthetic resin. The fluororesin may further comprise filler particles composed of various inorganic particles such as silica and alumina, and the like from the viewpoint of improving insulating properties, and the like. The thickness of the sheet-shaped fluororesin is not particularly limited but is preferably 1 to 1000 µm, more preferably 2 to 400 µm, and further preferably 3 to 200 µm. The fluororesin layer may be composed of a plurality of layers.

Method for Manufacturing Copper-Clad Laminate

The copper-clad laminate of the present invention can be manufactured by (1) providing a surface-treated copper foil and (2) affixing a sheet-shaped fluororesin to the zinc-containing layer side of the surface-treated copper foil.

(1) Provision of Surface-Treated Copper Foil

The surface-treated copper foil used for the manufacture of the copper-clad laminate of the present invention should comprise a zinc-containing layer that provides the above-described interfacial composition.

In the surface-treated copper foil used for the manufacture of the copper-clad laminate, when the interface between the copper foil and the zinc-containing layer is subjected to elemental analysis by X-ray photoelectron spectroscopy (XPS), the content of Zn is preferably 10% by weight or less, more preferably 1.0% by weight or more and 10.0% by weight or less, further preferably 2.0% by weight or more and 8.0% by weight or less, particularly preferably 2.1% by weight or more and 7.5% by weight or less, and most preferably 2.1% by weight or more and 7.0% by weight or less. When the interface between the copper foil and the zinc-containing layer is subjected to elemental analysis by XPS, the Zn/M weight ratio, the ratio of the content of Zn to the content of the transition element M, is preferably 0.2 or more and 0.6 or less, more preferably 0.22 or more and 0.58 or less, and further preferably 0.25 or more and 0.55 or less.

The Zn content and the Zn/M weight ratio are determined by the interface between the copper foil and the zinc-containing layer, and this interface refers to the portion of the zinc-containing layer directly on the copper foil. This portion is less likely to be affected by surface oxidation and the like and considered as a region important in providing adhesion force and heat resistance. The position (depth) of the interface between the copper foil and the zinc-containing layer is defined as the inflection point in the curve formed by measurement depth (horizontal axis) and the amount of Cu (vertical axis) in elemental analysis by XPS carried out in the depth direction from the zinc-containing layer toward the copper foil. Specifically, a determination is made by the following i) to vi) steps:

i) With the surface of the zinc-containing layer opposite to the copper foil being at measurement depth $D_1=0$ nm, elemental analysis by XPS is performed with digging down in the depth direction therefrom toward the copper foil by sputtering. Elemental analysis is performed at a point at measurement depth $D_1=0$ nm simultaneously with the start of measurement by XPS, and after this, elemental analysis is performed at a point at measurement depth $D_n$ (n represents a measurement point) every predetermined sputtering time (for example, 20 seconds) from the start of the measurement. The measurement is performed at equal time intervals, for example, the measurement point after 20 seconds from the start of the measurement is at $D_2$, and the measurement point after 40 seconds is at $D_3$. One preferred example of the XPS measurement conditions is shown below (more specific measurement conditions will be shown in Examples described later).

(Measurement Conditions)

Ion gun setting: Ar gas, 1 kV, 2 mm×2 mm

Sputtering rate: 3.43 nm/min ii) The content of Cu at a measurement point n, $C_n$ (% by weight), is measured according to the above i).

iii) A graph is made with measurement depth $D_n$ as the horizontal axis and the content of Cu, $C_n$, as the vertical axis, and for the obtained curve, the slope of the tangent at a measurement point n, $S_n=(C_{n+1}-C_n)/(D_{n+1}-D_n)$, is calculated.

iv) From the slope of the tangent, $S_n$, obtained, the rate of change of the slope of the tangent, $\Delta S_n=S_{n+1}-S_n$, is calculated.

v) From the rate of change of the slope of the tangent, $\Delta S_n$, obtained, curvature $c_n=\Delta S_n/(D_{n+1}-D_n)$ is calculated.

vi) The measurement point providing curvature $c_n=0$ is identified as the Cu inflection point, and the point at measurement depth $D_n$ where this Cu inflection point is present is determined as the interface between the copper foil and the zinc-containing layer. For the Cu inflection point, in order to avoid accidental curvature $c_n=0$ due to plus/minus fluctuations in curvature $c_n$, the measurement point at curvature $c_n=0$ in the region where curvature $c_n$ begins to stably converge toward 0 is adopted. By adopting such a method, the interface between the copper foil and the zinc-containing layer can be uniquely identified.

The surface-treated copper foil preferably further comprises a chromate layer and/or a silane coupling agent layer on the surface on the zinc-containing layer side and more preferably comprises both a chromate layer and a silane coupling agent layer. By further comprising the chromate layer and/or the silane coupling agent layer, the adhesion to a fluororesin substrate can also be improved by combination with the zinc-containing layer, in addition to the improvement of rust proofing properties, moisture resistance, and chemical resistance.

(2) Affixation of Fluororesin

The affixation of a fluororesin to the surface-treated copper foil should be performed according to a known procedure for manufacturing a copper-clad laminate and is not particularly limited. A method of affixing copper foils to an inner layer substrate via a fluororesin can also be adopted, and in this case, the affixation should be performed according to a known method such as the so-called buildup process. In any case, according to a preferred method for manufacturing the copper-clad laminate of the present invention, as the surface-treated copper foil comprising the zinc-containing layer, one having an interface having emission intensity ratios within the above ranges is selectively adopted and affixed to a fluororesin. Thus, it is possible to manufacture a copper-clad laminate having not only high adhesion but also excellent heat resistance with which the adhesion is less likely to deteriorate even at high temperature, between a copper foil and a fluororesin. The affixation of a fluororesin to the surface-treated copper foil is preferably performed by pressing with heating. The temperature during pressing should be appropriately determined according to the properties of the fluororesin used, and is not particularly limited but is preferably 150 to 500° C., more preferably 180 to 400° C. The pressure is not particularly limited either but is preferably 1 to 10 MPa, more preferably 2 to MPa.

Method for Manufacturing Surface-Treated Copper Foil

The surface-treated copper foil according to the present invention may be manufactured by any method as long as a zinc-containing layer can be formed on a copper foil. The surface-treated copper foil according to the present invention is preferably manufactured through zinc alloy plating. One example of a preferred method for manufacturing the surface-treated copper foil according to the present invention will be described below. This preferred manufacturing method comprises the steps of providing a copper foil, and performing zinc alloy plating on the surface.

(1) Preparation of Copper Foil

As the copper foil used for the manufacture of the surface-treated copper foil, both an electrodeposited copper foil and a rolled copper foil can be used, and the copper foil is more preferably an electrodeposited copper foil. The copper foil is preferably subjected to roughening treatment, and, for example, a roughening-treated surface in which roughening particles are deposited on a copper foil surface can be formed by electroplating using an aqueous solution comprising sulfuric acid and copper sulfate. The roughening-treated surface preferably has a maximum height Sz of 3.0 μm or more and 15.0 μm or less, more preferably 4.0 μm or more and 12.0 μm or less, as measured in accordance with ISO 25178. When the copper foil is prepared in the form of a carrier-attached copper foil, the copper foil may be formed by wet film formation processes such as an electroless copper plating process and an electrolytic copper plating process, dry film formation processes such as sputtering and chemical vapor deposition, or combinations thereof.

(2) Formation of Zinc-Containing Layer by Zinc Alloy Plating

A surface (for example, a roughening-treated surface) of the copper foil is preferably subjected to zinc alloy plating to form a zinc-containing layer. Examples of the zinc alloy plating include Zn—Co alloy plating, Zn—Fe alloy plating, Zn—Ni alloy plating, Zn—Mo alloy plating, Zn—W alloy plating, Zn—Ni—Mo alloy plating, and combinations thereof. The zinc alloy plating should be performed by a known electroplating method by preparing a plating solution so that the desired zinc alloy composition is obtained. For example, when Zn—Ni alloy plating is performed, electroplating is preferably performed using an aqueous solution comprising zinc oxide, nickel sulfate, and potassium diphosphate.

(3) Chromate Treatment

Chromate treatment is preferably performed on the copper foil on which the zinc-containing layer is formed, to form a chromate layer. For the chromate treatment, electrolysis is preferably performed at a current density of 0.1 to 10 A/dm$^2$ using a chromate treatment liquid having a chromic acid concentration of 0.5 to 8 g/L and a pH of 1 to 13, and this electrolysis is preferably performed for 1 to 30 seconds.

(4) Silane Coupling Agent Treatment

The copper foil is preferably subjected to silane coupling agent treatment to form a silane coupling agent layer. The silane coupling agent layer can be formed by appropriately diluting a silane coupling agent, applying the diluted silane coupling agent, and drying it. Examples of the silane coupling agent include (i) epoxy functional silane coupling agents such as 4-glycidylbutyltrimethoxysilane and 3-glycidoxypropyltrimethoxysilane, (ii) amino functional silane coupling agents such as 3-aminopropyltriethoxysilane, N-2-(aminoethyl)-3-aminopropyltrimethoxysilane, N-3-(4-(3-aminopropoxy)butoxy)propyl-3-aminopropyltrimethoxysilane, and N-phenyl-3-aminopropyltrimethoxysilane, (iii) mercapto functional silane coupling agents such as 3-mercaptopropyltrimethoxysilane, (iv) olefin functional silane coupling agents such as vinyltrimethoxysilane and vinylphenyltrimethoxysilane, (v) acrylic functional silane coupling agents such as 3-methacryloxypropyltrimethoxysilane, (vi) imidazole functional silane coupling agents such as imidazolesilane, and (vii) triazine functional silane coupling agents such as triazinesilane. When both the chromate layer and the silane coupling agent layer are formed on the surface of the zinc-containing layer, the order of forming them is not particularly limited.

Printed Wiring Board

The copper-clad laminate of the present invention is preferably used for the fabrication of a printed wiring board. That is, according to a preferred aspect of the present invention, a printed wiring board manufactured using the copper-clad laminate is provided. Specific examples regarding the printed wiring board include single-sided or double-sided printed wiring boards obtained by forming a circuit on the copper-clad laminate of the present invention, and multilayer printed wiring boards obtained by multilayering the single-sided or double-sided printed wiring boards. The multilayer printed wiring board may be obtained by forming circuits on a multilayer copper-clad laminate obtained by affixing copper foils to an inner layer substrate via a thermoplastic resin (for example, a fluororesin), or by further forming a buildup layer. The circuit formation method may be a subtractive process or a modified semi-additive process (MSAP). The printed wiring board fabricated using the copper-clad laminate of the present invention is suitably used as a high frequency substrate used in applications such as automobile antennas, cellular phone base station antennas, high performance servers, and anti-collision radars used in a high frequency band of signal frequencies of 10 GHz or more.

EXAMPLES

The present invention will be more specifically described by the following examples.

Examples 1 to 7

(1) Preparation of Surface-Treated Copper Foils

Various surface-treated copper foils comprising zinc-containing layers on copper foil surfaces based on known methods were provided. These surface-treated copper foils are obtained by sequentially subjecting the electrode surface of an electrodeposited copper foil (thickness 35 μm) to roughening treatment, Zn—Ni alloy plating (examples 1 to 5) or Zn—Ni—Mo alloy plating (examples 6 and 7), chromate treatment, and silane coupling agent treatment by known methods. For each surface-treated copper foil, elemental analysis was performed by XPS with digging down in the depth direction from the zinc-containing layer toward the copper foil by sputtering. This elemental analysis was performed under the following measurement conditions using a scanning dual X-ray photoelectron spectrometer (XPS) (manufactured by ULVAC-PHI, PHI Quantes).

(Measurement Conditions)

Output: 200 μm φ, 50 W

X-ray type: monochromatic Al Kα ray

Ion gun setting: Ar gas, 1 kV (examples 1 to 5) or 2 kV (examples 6 and 7), 2 mm×2 mm Sputtering rate (in terms of SiO$_2$): 3.43 nm/min (examples 1 to 5) or 12.3 nm/min (examples 6 and 7)

Measured elements and orbitals: C 1s, O 1s, Si 2p, Cr 3p, Ni 2p3, Cu 2p3, Zn 2p3, Mo 3d (only examples 6 and 7)

Measured surface: measured from the zinc-containing layer toward the interface

The position (depth) of the interface between the copper foil and the zinc-containing layer was determined by identifying the Cu inflection point based on the obtained elemental analysis results according to the above-described definition and procedure. The copper foil had been subjected to roughening treatment, and in the identification of the position of the interface, the roughening-treated layer (roughening particles) was considered to be also included in the copper foil. Then, the content of the Zn element in the total weight of the measured elements at the interface was calculated as the Zn content (% by weight), and the content of the transition element M (meaning Ni and Mo here) in the total weight of the measured elements at the interface was calculated as the M content (% by weight). The Zn/M weight ratio was calculated using the obtained Zn content and M content. The results were as shown in Table 1A.

(2) Fabrication of Copper-Clad Laminate

As a fluoro resin substrate, a PTFE substrate (RO3003 Bondply, manufactured by ROGERS Corporation, thickness 125 µm, 1 ply) was provided. The surface-treated copper foil was laminated on this PTFE substrate so that the surface of the surface-treated copper foil on the zinc-containing layer side was abutted to the substrate. The laminate was pressed under the conditions of a pressure of 2.4 MPa, a temperature of 370° C., and a pressing time of 30 minutes using a vacuum press to fabricate a copper-clad laminate.

(3) Evaluation of Copper-Clad Laminate

For the fabricated copper-clad laminate, the various evaluations shown below were performed.

<Elemental Analysis of Interface Between Copper Foil and Zinc-Containing Layer>

Elemental analysis by GD-OES was performed with digging down in the depth direction from the copper foil side toward the PTFE substrate of the copper-clad laminate by sputtering. This elemental analysis was performed under the following measurement conditions using a glow discharge optical emission spectrometer (manufactured by JOBIN YVON, JY-5000RF).

(Measurement Conditions)
Output: 30 W
Gas pressure: 665 Pa (gas type: Ar)
Sputtering rate: 7 µm/min (in terms of Cu)
D.S. (duty cycle)=0.0625 (the proportion of the time of the ON state of sputtering to the total of the time of the ON state of sputtering and the time of the OFF state of sputtering)
Frequency: 100 Hz
step (sec)/point: 0.1 (the intervals between measurement points; the measurement was performed at one point per 0.1 seconds)

Measurement mode: the measurement was performed in the normal mode for 140 sec, and then the measurement was carried out with the mode switched to the pulse mode (for measurement time reduction)

Measured elements: C, O, N, Si, Cr, Ni, Cu, Zn, Mo (only examples 6 and 7)

The interface between the copper foil and the zinc-containing layer was identified by drawing two tangents $L_1$ and $L_2$ and obtaining their intersection point X, based on the obtained depth profile of Cu emission intensity according to the above-described definition and procedure. The emission intensity of Cu referred to as $I_{Cu}$, the emission intensity of Zn referred to as $I_{Zn}$, and the emission intensity of the transition element M referred to as $I_M$ (corresponding to the total emission intensity of Ni and Mo in the present examples), at the sputtering time (depth) corresponding to the interface thus identified as the intersection point X were read from the depth profiles of the emission intensities of the elements. From these emission intensities, the emission intensity ratios $I_{Zn}/I_{Cu}$ and $I_{Zn}/I_M$ were calculated. The results were as shown in Table 1A. The depth profiles of emission intensities shown in FIG. 1 are obtained in example 2.

<Normal State Peel Strength to Fluororesin (PTFE)>

A 0.4 mm wide straight circuit was formed on the copper-clad laminate by a subtractive process using a cupric chloride etchant to obtain a test substrate comprising a straight circuit for peel strength measurement. This straight circuit was peeled off from the PTFE substrate in accordance with the A method (90° peel) in JIS C 5016-1994, and the normal state peel strength (kgf/cm) was measured. This measurement was performed using a table-top precision universal tester (AGS-50NX, manufactured by SHIMADZU CORPORATION). The results were as shown in Table 1B.

<Heat-Resistant Peel Strength to Fluororesin (PTFE)>

The heat-resistant peel strength (kgf/cm) to PTFE was measured by the same procedure as the normal state peel strength to PTFE described above, except that a test substrate comprising a 0.4 mm wide straight circuit for peel strength measurement was placed in an oven, heated at 150° C. for 4 hours, and floated on a solder bath at 288° C. for 10 seconds. The results were as shown in Table 1B.

<Heat-Resistant Deterioration Rate>

The decrease rate (%) of the heat-resistant peel strength to the normal state peel strength was calculated as the heat-resistant deterioration rate. The results were as shown in Table 1B.

<Comprehensive Evaluation>

For each example, comprehensive evaluation was performed according to the following criteria:

Accepted: one having a normal state peel strength of 1.2 kgf/cm or more and a heat-resistant deterioration rate of 10% or less Rejected: one corresponding to at least either one of a normal state peel strength of less than 1.2 kgf/cm or a heat-resistant deterioration rate of more than 10%

TABLE 1A

| | Elemental analysis by XPS for interface between copper foil and zinc-containing layer in surface-treated copper foil used | | | | Elemental analysis by GD-OES for interface between copper foil and zinc-containing layer in copper-clad laminate | | | | | |
|---|---|---|---|---|---|---|---|---|---|---|
| | Cu inflection point (nm) | Zn (% by weight) | Ni (% by weight) | Mo (% by weight) | Zn/M weight ratio (M = Ni + Mo) | Cu emission intensity $I_{Cu}$ | Zn emission intensity $I_{Zn}$ | Ni emission intensity | Mo emission intensity | $I_{Zn}/I_{Cu}$ | $I_{Zn}/I_M$ (M = Ni + Mo) |
| Ex. 1 | 18.9 | 3.0 | 6.1 | — | 0.50 | 3.45 | 0.0086 | 0.0200 | — | $2.5 \times 10^{-3}$ | 0.42 |
| Ex. 2 | 18.9 | 5.1 | 10.5 | — | 0.48 | 3.29 | 0.0078 | 0.0220 | — | $2.4 \times 10^{-3}$ | 0.36 |
| Ex. 3* | 18.9 | 13.9 | 8.1 | — | 1.72 | 3.33 | 0.0141 | 0.0170 | — | $4.2 \times 10^{-3}$ | 0.83 |
| Ex. 4* | 18.9 | 1.3 | 1.6 | — | 0.87 | 3.76 | 0.0046 | 0.0180 | — | $1.2 \times 10^{-3}$ | 0.25 |
| Ex. 5* | 18.9 | 26.7 | 12.2 | — | 2.18 | 3.41 | 0.0194 | 0.0190 | — | $5.7 \times 10^{-3}$ | 1.04 |
| Ex. 6 | 30.7 | 1.1 | 3.0 | 0.4 | 0.32 | 2.928 | 0.0073 | 0.0197 | 0.0023 | $2.5 \times 10^{-3}$ | 0.33 |
| Ex. 7 | 30.7 | 1.8 | 5.3 | 0.7 | 0.29 | 2.704 | 0.0075 | 0.0205 | 0.0018 | $2.8 \times 10^{-3}$ | 0.33 |

*indicates a comparative example.

TABLE 1B

| | Properties of copper-clad laminate | | | |
|---|---|---|---|---|
| | Normal state peel strength (kgf/cm) | Heat-resistant peel strength (kgf/cm) | Heat-resistant deterioration rate (%) | Comprehensive evaluation |
| Ex. 1 | 1.67 | 1.62 | 3.0 | Accepted |
| Ex. 2 | 1.59 | 1.59 | 0.0 | Accepted |
| Ex. 3* | 1.08 | 1.05 | 2.8 | Rejected |
| Ex. 4* | 1.40 | 1.06 | 24.3 | Rejected |
| Ex. 5* | 1.17 | 1.05 | 10.3 | Rejected |
| Ex. 6 | 1.67 | 1.65 | 1.2 | Accepted |
| Ex. 7 | 1.59 | 1.61 | −1.3 | Accepted |

*indicates a comparative example.

From the results shown in Tables 1A and 1B, it is seen that in examples 1, 2, 6, and 7 satisfying the conditions of the present invention, an emission intensity ratio $I_{Zn}/I_{Cu}$ of $3.0 \times 10^{-3}$ or less and an emission intensity ratio $I_{Zn}/I_M$ of 0.30 or more and 0.50 or less at the interface between the copper foil and the zinc-containing layer, the peel strength is generally high (that is, the adhesion is high), and the heat-resistant deterioration rate is significantly low (that is, the heat resistance is excellent), compared with the comparative examples, which are examples 3 to 5, not satisfying these conditions.

The invention claimed is:

1. A copper-clad laminate comprising:
   a surface-treated copper foil comprising a copper foil and a zinc-containing layer provided on at least one surface of the copper foil; and
   a sheet-shaped fluororesin provided on the zinc-containing layer side of the surface-treated copper foil,
   wherein the zinc-containing layer is composed of Zn and a transition element M having a melting point of 1200° C. or more, and
   wherein when an interface between the copper foil and the zinc-containing layer is subjected to elemental analysis by glow discharge optical emission spectrometry (GD-OES), an emission intensity ratio $I_{Zn}/I_{Cu}$, which is a ratio of an emission intensity of Zn referred to as $I_{Zn}$ to an emission intensity of Cu referred to as $I_{Cu}$, is $3.0 \times 10^{-3}$ or less, and an emission intensity ratio $I_{Zn}/I_M$, which is a ratio of an emission intensity of Zn referred to as $I_{Zn}$ to an emission intensity of the transition element M referred to as $I_M$, is 0.30 or more and 0.50 or less.

2. The copper-clad laminate according to claim 1, wherein the transition element M is at least one selected from the group consisting of Co, Fe, Ni, Mo, and W.

3. The copper-clad laminate according to claim 1, wherein the transition element M is Ni and/or Mo.

4. The copper-clad laminate according to claim 1, wherein the emission intensity ratio $I_{Zn}/I_{Cu}$ is $1.5 \times 10^{-3}$ or more and $3.0 \times 10^{-3}$ or less.

5. The copper-clad laminate according to claim 1, wherein the emission intensity ratio $I_{Zn}/I_M$ is 0.30 or more and 0.45 or less.

6. The copper-clad laminate according to claim 1, wherein the emission intensity ratio $I_{Zn}/I_M$ is 0.35 or more and 0.45 or less.

7. The copper-clad laminate according to claim 1, wherein the fluororesin is at least one selected from the group consisting of polytetrafluoroethylene, a tetrafluoroethylene-perfluoroalkyl vinyl ether copolymer, a tetrafluoroethylene-hexafluoropropylene copolymer, and a tetrafluoroethylene-ethylene copolymer.

8. The copper-clad laminate according to claim 1, wherein a surface of the copper foil on the zinc-containing layer side is a roughening-treated surface.

9. A printed wiring board manufactured using the copper-clad laminate according to claim 1.

* * * * *